(12) United States Patent
Pharand et al.

(10) Patent No.: US 7,828,504 B2
(45) Date of Patent: Nov. 9, 2010

(54) COMBINATION LOAD LOCK FOR HANDLING WORKPIECES

(75) Inventors: Michel Pharand, Chelmsford, MA (US); Klaus Becker, Kensington, NH (US); Klaus Petry, Merrimac, MA (US); Marvin R. LaFontaine, Kingston, NH (US); Michael R. Mitrano, Wilmington, MA (US)

(73) Assignee: Axcellis Technologies, Inc., Beverly, MA (US)

( * ) Notice: Subject to any disclaimer, the term of this patent is extended or adjusted under 35 U.S.C. 154(b) by 1021 days.

(21) Appl. No.: 11/432,923

(22) Filed: May 12, 2006

(65) Prior Publication Data

US 2007/0264105 A1 Nov. 15, 2007

(51) Int. Cl.
*H01L 21/677* (2006.01)
(52) U.S. Cl. ...................................... 414/217
(58) Field of Classification Search .............. 414/217, 414/221, 220
See application file for complete search history.

(56) References Cited

U.S. PATENT DOCUMENTS

| | | | |
|---|---|---|---|
| 5,308,989 A * | 5/1994 | Brubaker | 250/441.11 |
| 5,611,655 A * | 3/1997 | Fukasawa et al. | 414/217 |
| 6,090,176 A * | 7/2000 | Yoshitake et al. | 55/385.4 |
| 6,215,897 B1 | 4/2001 | Beer et al. | |
| 6,406,598 B2 * | 6/2002 | Lee et al. | 204/192.12 |
| 6,585,470 B2 * | 7/2003 | Van Der Meulen | 414/217 |
| 6,635,115 B1 * | 10/2003 | Fairbairn et al. | 118/719 |
| 6,702,865 B1 * | 3/2004 | Ozawa et al. | 29/25.01 |
| 6,742,980 B2 * | 6/2004 | Sasaki | 414/783 |
| 6,847,730 B1 | 1/2005 | Beer et al. | |
| 6,926,012 B2 * | 8/2005 | Biberger et al. | 134/1.3 |
| 6,950,721 B2 * | 9/2005 | Tashiro et al. | 700/213 |
| 7,012,684 B1 * | 3/2006 | Hunter | 356/237.5 |
| 2005/0118002 A1 * | 6/2005 | Kasumi | 414/221 |
| 2006/0182539 A1 * | 8/2006 | Ozawa et al. | 414/217 |

FOREIGN PATENT DOCUMENTS

JP 10223743 A * 8/1998

* cited by examiner

*Primary Examiner*—Gregory W Adams
*Assistant Examiner*—Joshua I Rudawitz
(74) *Attorney, Agent, or Firm*—Eschweiler & Associates, LLC

(57) ABSTRACT

A combination load lock apparatus is provided, wherein a chamber is coupled to two or more valves in selective fluid communication with two or more respective volumes. A support member for supporting a workpiece is disposed within an interior portion of the chamber, wherein a translation apparatus is operably coupled thereto. The translation apparatus is operable to rotate and/or translate the workpiece on the support member about and/or along a first axis, wherein a detection apparatus associated with the chamber is operable to detect one or more characteristics of the workpiece during the rotation and/or translation thereof. The workpiece may be further rotated in a predetermined manner based on the one or more detected characteristics. A recess is further defined in the interior portion of the chamber, wherein the translation apparatus is operable to translate the workpiece into and out of the recess to reduce particulate contamination thereon.

19 Claims, 6 Drawing Sheets

COMBINATION LOAD LOCK FOR HANDLING WORKPIECES

FIELD OF THE INVENTION

The present invention relates generally to workpiece handling systems and methods for handling workpieces, and more specifically to a combination load lock chamber for handling and characterizing workpieces.

BACKGROUND OF THE INVENTION

In the semiconductor manufacturing industry, a semiconductor wafer is typically processed in various differing processing environments in order to achieve desired electrical characteristics on the wafer. Conventionally, the wafer is transported between processing environments through one or more load lock chambers, wherein the load lock chambers substantially isolate the different processing environments from one another by substantially evacuating the load lock chambers of processing gases once the wafer is inserted therein. Such isolation of the processing environments via the load lock chambers helps to minimize cross-contamination between the processing environments.

Conventionally, a load lock chamber is coupled to a process chamber, such as a process chamber for an ion implantation system. FIG. 1 illustrates an exemplary conventional processing system 10, wherein a load lock chamber 15 is coupled to a process chamber 20 via a first gate valve 25. The first gate valve 25 selectively isolates a process environment 30 within the process chamber 20 from a load lock environment 35 within the load lock chamber 15. A second gate valve 40 is disposed opposite the first gate valve 25, wherein the second gate valve selectively isolates the load lock environment 35 from an external environment 45 (e.g., atmosphere). Typically, the load lock chamber further comprises one or more ports 50 that selectively permit an evacuation or venting of the load lock environment 35, depending on whether a wafer 55 is being transferred between the external environment 45 and the load lock environment 35, or between the load lock environment and the process environment 30.

One problem with the conventional load lock chamber 15 is that contamination particles 60 may be present within the load lock environment 35, wherein upon evacuation or venting through the one or more ports 50, the contamination particles may be moved onto a surface 65 of the wafer 55. Such contamination particles 60 on the surface 65 of the wafer 55 can have deleterious effects on the subsequent processing of the wafer, thus leading to potential production losses. For example, the location of the one or more ports 50 and wafer 55 may lead to turbulent flows within the load lock environment 35, thus dispersing the contaminant particles 60 about the surface 65 of the wafer 55.

Further, various pre-processing procedures are typically performed prior to the wafer 55 being transferred into the process environment 30. Such pre-processing procedures may comprise a notch alignment procedure, wherein the wafer 55 is aligned in a predetermined manner, an identification of the wafer by reading of a barcode (not shown) on a backside 70 of the wafer, or various other pre-processing such as a heating or cooling of the wafer prior to, or after, the wafer is transferred into or out of the process environment 30. Typically, each pre-processing procedure on the wafer 55 is performed in a respective pre-processing station 75, wherein the wafer is transferred from one pre-processing station to another, and then into the load lock chamber 15. Such conventional pre-processing of the wafer 55 can take a significant amount of time, as identifying and/or positioning of the wafer, as well as transferring the wafer between each pre-processing station typically occurs prior to the wafer entering the load lock chamber 15.

Therefore, it is desirable to provide an improved load lock apparatus, wherein contamination to the wafer is significantly decreased, while also allowing various pre-processing procedures to be performed from within the load lock apparatus, thus increasing overall production efficiencies.

SUMMARY OF THE INVENTION

The present invention overcomes the limitations of the prior art by providing a combination load lock apparatus, wherein contamination is minimized, and wherein various processes can be performed on a workpiece within the load lock apparatus. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a combination lock apparatus for a workpiece, wherein, in addition to changing atmospheric conditions between processing operations, the combination load lock apparatus is further operable to advantageously detect one or more characteristics of the workpiece, wherein the detected characteristics can be utilized in handling the workpiece. In accordance with one exemplary aspect of the invention, the combination load lock apparatus comprises a chamber having an interior portion, wherein a central region and a recess are further defined therein. A support member is further disposed within the interior portion of the chamber, wherein the support member is operable to support the workpiece, and wherein a translation apparatus is operably coupled to the support member. The translation apparatus, in one example, is operable to rotate the support member about a first axis, and also to linearly translate the support member along the first axis between the central region and the recess within the interior portion of the chamber. A detection apparatus associated with the chamber is further operable to detect one or more characteristics of the workpiece during the rotation and/or translation of the workpiece.

In accordance with one exemplary aspect, the workpiece comprises an indicia associated therewith, and wherein the detection apparatus comprises a sensor operable to detect the indicia. The indicia may be a notch in the workpiece, a barcode on a backside of the workpiece, or other type of identifying characteristic associated with the workpiece. Accordingly, the detection apparatus may comprise a proximity sensor, camera, bar code scanner, or other apparatus operable to detect the indicia. The detection apparatus, in one example, is operably coupled to the chamber, wherein the detection apparatus is operable to detect the one or more characteristics of the workpiece when the workpiece is positioned within the recess. For example, when the workpiece is positioned within the recess, the workpiece is rotated via the translation apparatus, wherein the detection apparatus detects the indicia and sends a signal to a controller, and wherein the controller further controls a handling of the workpiece based on the signal from the detection apparatus. The controller, for example, can provide a further control of the translation apparatus, such that the workpiece is rotated so as to position the workpiece in a predetermined manner based on the sensed notch or other indicia.

According to another exemplary aspect of the invention, two or more valves, such as gate valves, are further operably coupled to the chamber, wherein the two or more valves are operable to selectively permit a fluid communication between two or more respective volumes and the interior portion of the chamber. A pump port and a vent port may be further associated with the chamber, wherein the pump port is in selective fluid communication with a vacuum environment and the interior portion of the chamber, and wherein the pump port is operable to selectively expose the interior portion of the chamber to the vacuum environment. The vent port is accordingly in selective fluid communication with a pressurized environment and the interior portion of the chamber, wherein the vent port is operable to selectively expose the interior portion of the chamber to the pressurized environment, such as an atmospheric environment or process gas environment.

According to one exemplary aspect, the pump port is associated with a bottom portion of the chamber, and the vent port is associated with the recess in the chamber, wherein when the workpiece is positioned within the recess by the translation apparatus, substantially laminar flow can be attained proximate to the workpiece, such that contamination from turbulent flows within the chamber is substantially minimized. A high efficiency filter may be in further fluid communication with the vent port, wherein the filter is operable to substantially filter particles associated with the pressurized environment. Additionally, a temperature control apparatus may be associated with the chamber, wherein the temperature control apparatus is operable to provide one or more of a heating and cooling of the workpiece within the chamber.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
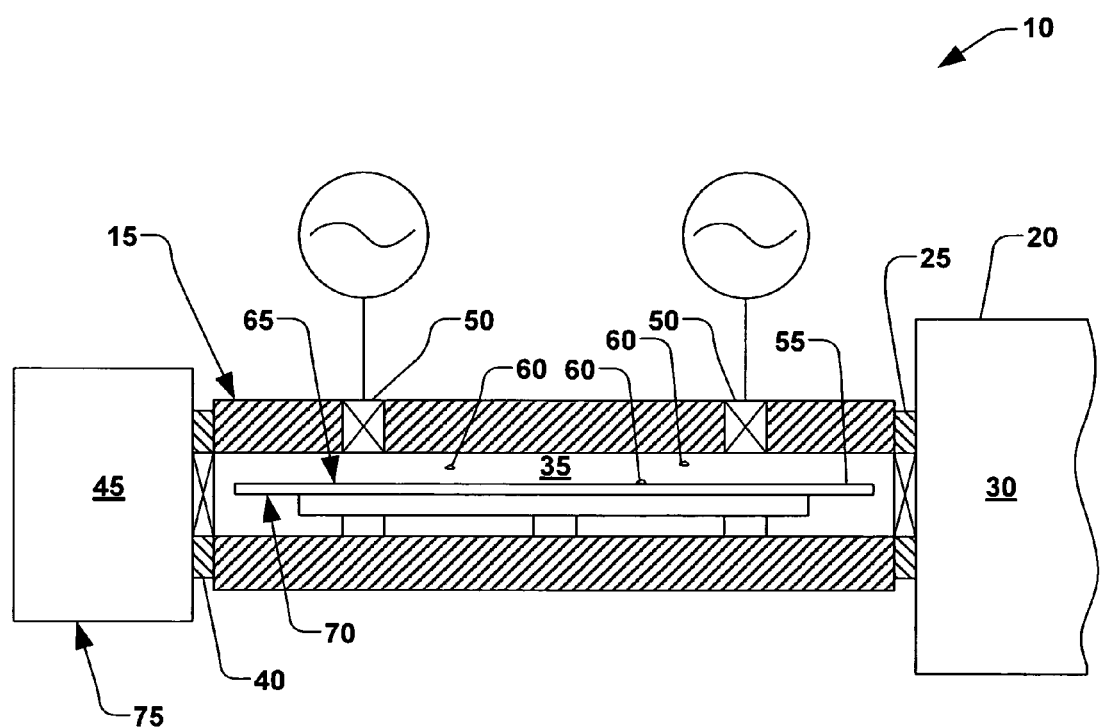
FIG. 1 is a cross-sectional view of a conventional load lock apparatus of the prior art.

The present invention is directed generally toward a combination load lock apparatus and a method for using a load lock apparatus, wherein various efficiencies can be achieved. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
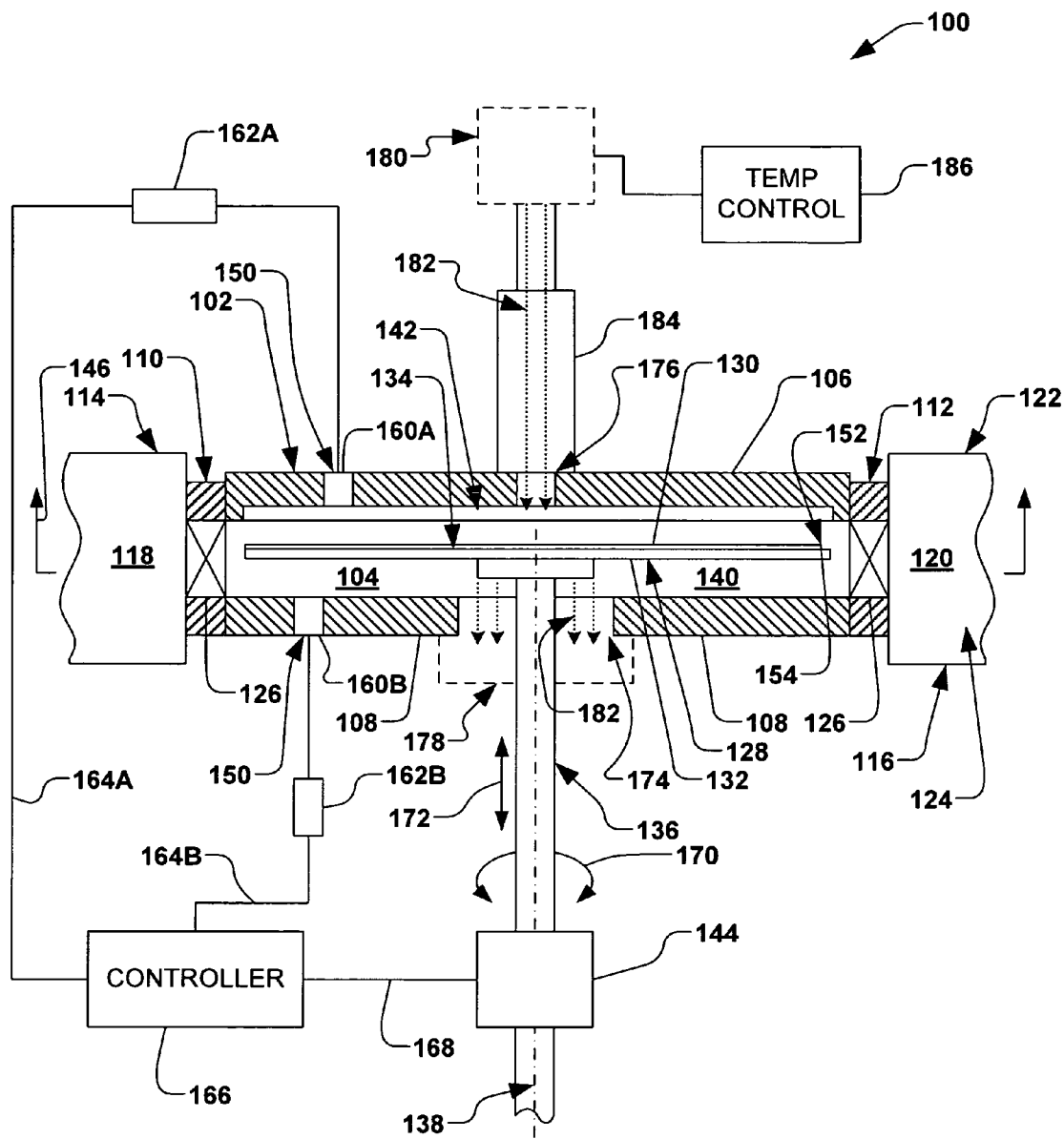
FIG. 2 illustrates a cross-sectional view of exemplary combination load lock apparatus according to one aspect of the present invention.

Referring now to the figures, FIG. 2 illustrates a cross-sectional view of an exemplary combination load lock apparatus 100 in accordance with several aspects of the present invention. The load lock apparatus 100, for example, comprises a chamber 102, wherein an interior portion 104 of the chamber is generally defined between a top wall 106 and a bottom wall 108 of the chamber. A first valve 110 and a second valve 112 are further operably coupled to the chamber 102, wherein the first valve is associated with a first volume 114, and the second valve is associated with a second volume 116. The first valve 110 and second valve 112 are operable to selectively permit a fluid communication between the interior portion 104 of the chamber and the respective first volume 114 and second volume 116.

The first volume 114, for example, may comprise an atmospheric environment 118, and the second volume 116 may comprise a process environment 120 associated with a process chamber 122. The process environment 120, for example, may be a vacuum environment 124, wherein the process environment is at a significantly lower pressure than the atmospheric environment 118. The first valve 110 and second valve 112 may each further comprise gate valves 126, wherein the gate valves are operable to selectively isolate each of the respective first and second volumes 114 and 116 from the interior portion 104 of the chamber 102. It should be noted that any number of additional volumes (not shown) may be operably coupled to the chamber 102, wherein the additional volumes may be further selectively isolated from the chamber by additional valves (not shown) similar to the first and second valves 12, as will be appreciated by one of ordinary skill in the art.

In accordance with one exemplary aspect of the invention, the combination load lock apparatus 100 comprises a support member 128 generally disposed within the interior portion 104 of the chamber 102, wherein the support member is operable to support a workpiece 130 thereon. The workpiece 130, for example, is further operable to be transferred into and out of the chamber 102 though the first valve 110 and second valve 112 by a workpiece handling system (not shown), wherein the workpiece handling system is operable to place the workpiece with respect to the support member 128. The support member 128, for example, may comprise a platter or chuck 132, wherein the chuck is operably to substantially hold or restrain the workpiece 130 from moving with respect to the support member. The chuck 132, for example, may comprise an electrostatic chuck operable to selectively electrostatically attract the workpiece 130 thereto, therein substantially limiting a movement of the workpiece with respect to the support member 128. Alternatively, the support member 128 may comprise any mechanism operable to substantially limit a movement of the workpiece 130 with respect to the support member. In another alternative, the support member 128 comprises one or more surfaces 134 on which the workpiece 130 is generally held by gravity. Accordingly, the support member 128 may comprise any structure on which the workpiece 130 may reside within the chamber 102.

The combination load lock apparatus 100 of the present invention further comprises a translation apparatus 136 operably coupled to the support member 128, wherein the translation apparatus is operable to move the workpiece 130 in one or more directions. For example, the translation apparatus 136 is operable to rotate the support member 128 about a first axis 138. The translation apparatus 136, in another example, is further operable to linearly translate the support member 128 along the first axis 138 within the interior portion 104 of the chamber 102, such as between a central region 140 of the interior portion of the chamber and a recess 142 defined in the top wall 106 of the chamber. The translation apparatus 136 may be operably coupled to one or more actuators 144, such as one or more of an electro-mechanical actuator, rotary actuator, servo motor, or a pneumatic actuator such as a piston and cylinder assembly, wherein the one or more actuators are operable to rotate and/or linearly translate the support member 128 about and/or along the first axis 138.

Figure 3:
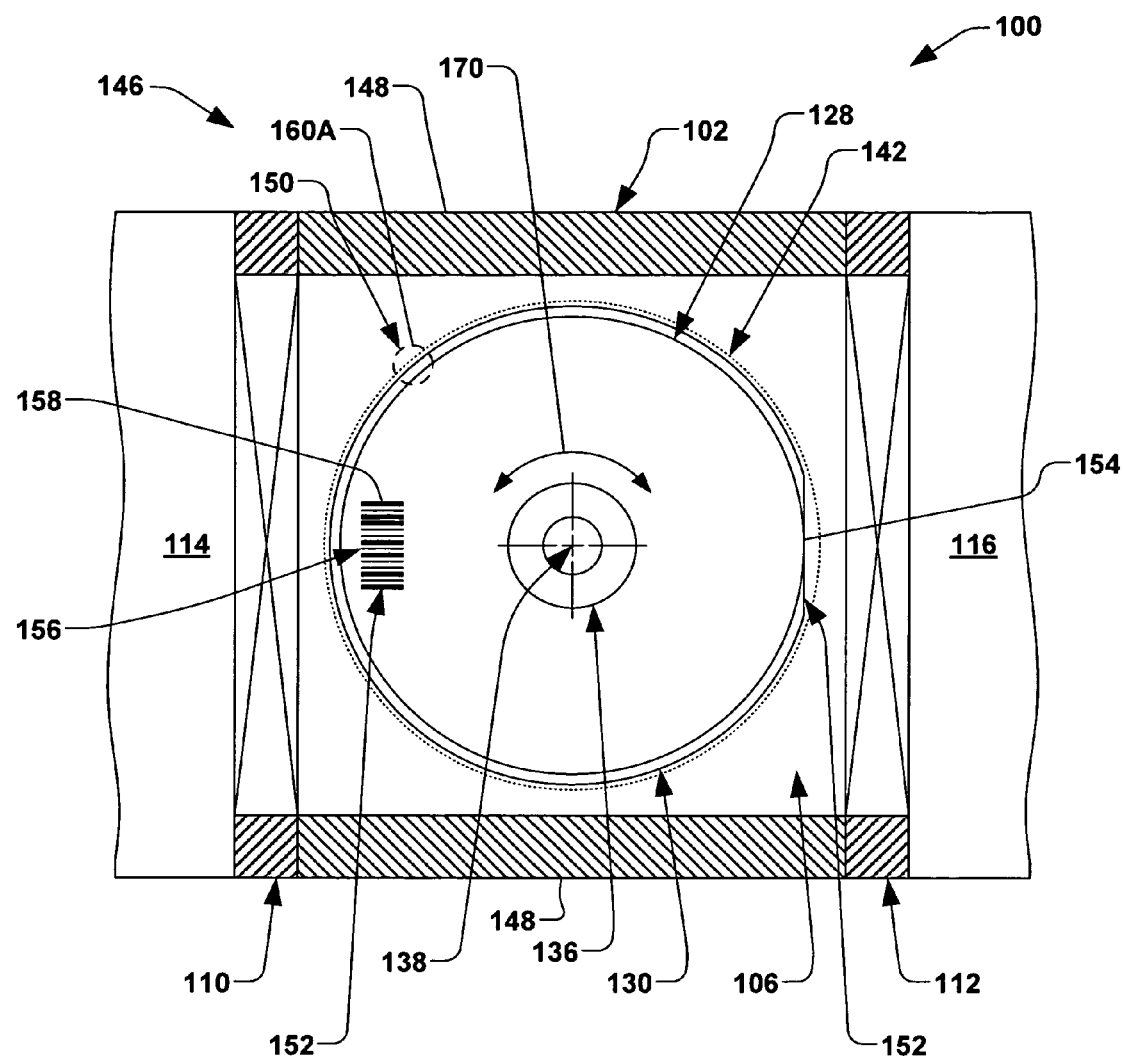
FIG. 3 illustrates another cross-sectional view of the exemplary combination load lock apparatus of FIG. 2 in accordance with another exemplary aspect of the invention.

FIG. 3 illustrates another exemplary aspect of the invention, wherein a cross section 146 of the combination load lock apparatus 100 of FIG. 2 is shown. The combination load lock apparatus 100 of FIG. 3, for example, illustrates side walls 148 of the chamber, and again illustrates the first valve 110 and second valve 112 coupling the chamber 102 to the respective first and second volumes 114 and 116. The recess 142 in the top wall 106 is further illustrated, wherein a shape of the recess generally conforms to a shape of the workpiece 130. For example, the recess 142 is generally circular in shape, and slightly larger in diameter than the workpiece 130. Accordingly, the translation apparatus 136 is operable to generally translate workpiece 130 along the first axis 138 into the recess 142. The recess 142, for example can advantageously limit particulate contamination of the workpiece during an evacuation of the chamber 102, as will be discussed infra.

Referring again to FIG. 2, in accordance with another exemplary aspect of the present invention, the combination load lock apparatus 100 further comprises a detection apparatus 150 associated with the chamber 102. The detection apparatus 150 is operable to detect one or more characteristics 152 associated with the workpiece 130. The one or more characteristics 152, as illustrated in FIG. 3 for example, may comprise one or more of a notch 154 defined in the workpiece 130 and one or more indicia 156 associated with the workpiece, such as a barcode 158 or other identifying characteristic. In one example, the detection apparatus 150 illustrated in FIG. 2 comprises sensors 160A and 160B operably coupled to respective control electronics 162A and 162B, wherein the sensors are operable to detect the one or more characteristics 152 (e.g., the notch 154 and the indicia 156 of FIG. 3). The control electronics 162A and 162B, for example, are further operable to provide signals 164A and 164B to a controller 166 indicative of the one or more characteristics. The controller 166 may then further provide a control signal 168 based on the signals 164A and 164B to the one or more actuators 144, such that the workpiece 130 is accordingly rotated 170 and/or translated 172, as will be discussed hereafter. It should also be noted that the control electronics 162A and 162B may be further integrated into the controller 166.

In accordance with one exemplary aspect, wherein the indicia 156 comprises the barcode 158 or other image associated with the workpiece 130, the sensor 164B may comprise a bar code scanner or other appropriate imaging device operable to detect the barcode or image, as will be appreciated by one of ordinary skill in the art. Further, the exemplary sensor 160A for detecting the notch 154 may comprise a proximity sensor or other appropriate detection device operable to detect the presence or absence of the notch 154, as will be appreciated by one of ordinary skill in the art. According to another example, the detection apparatus 150 is operably coupled to the top wall 106 or bottom wall 108 of the chamber 102, wherein the detection apparatus is operable to detect the one or more characteristics 152 associated with the workpiece 130 when the workpiece is positioned within the recess 142. For example, the detection apparatus 150 (e.g., the sensor 160A) is operable to detect the notch 154 during the rotation 170 of the workpiece 130 about the first axis 138 via the translation apparatus 136, wherein the notch may be aligned with respect to the chamber 102 in a predetermined manner via the control signal 168 to the one or more actuators 144, as will be discussed infra.

In accordance with another aspect of the present invention, the combination load lock apparatus 100 illustrated in FIG. 2 further comprises a pump port 174 and a vent port 176 associated with the chamber 102. The pump port 174, for example, is in fluid communication with a vacuum environment 178 (e.g., a vacuum pump) and the interior portion 104 of the chamber 102, wherein the pump port is operable to selectively expose the interior portion of the chamber to the vacuum environment. The vent port 176, for example, is in fluid communication with a pressurized environment 180 (e.g., an inert gas source) and the interior portion 104 of the chamber 102, wherein the vent port is operable to selectively expose the interior portion of the chamber to the pressurized environment. In one example, the pump port 174 is associated with the bottom wall 108 of the chamber 102, and the vent port 176 is associated with the recess 142 in the chamber. Accordingly, when the workpiece 130 is positioned within the recess 142, gas flow (illustrated by arrows 182) is believed to be substantially laminar within the recess, such that contamination to the workpiece 130 is substantially mitigated.

According to another example, the combination load lock apparatus 100 further comprises a filter 184 (e.g., a high efficiency particle filter) in fluid communication with the vent port 176, wherein the filter is operable to substantially filter particles (not shown) associated with the pressurized environment 180. Thus, the filter 184, in conjunction with the laminar flow within the recess 142 when the workpiece 130 is positioned therein, further mitigates potential contamination of the workpiece during "pump down", which is when the chamber 102 is substantially evacuated through the pump port 174, and/or when the vent port provides filtered gas into the interior portion 104 of the chamber.

In accordance with another exemplary aspect of the invention, a temperature control apparatus 186 is further associated with the chamber 102, wherein the temperature control apparatus is operable to provide one or more of a heating and cooling of the workpiece 130 positioned within the chamber. For example, the temperature control apparatus 186 is operable to heat and/or cool gases provided by the pressurized environment 180, thus heating and/or cooling the workpiece 130 via the vent port 176. Alternatively, the temperature control apparatus 186 may heat and/or cool the chamber 102, such as by heating and/or cooling one or more of the top wall 106 and bottom wall 108 of the chamber.

Figure 4:
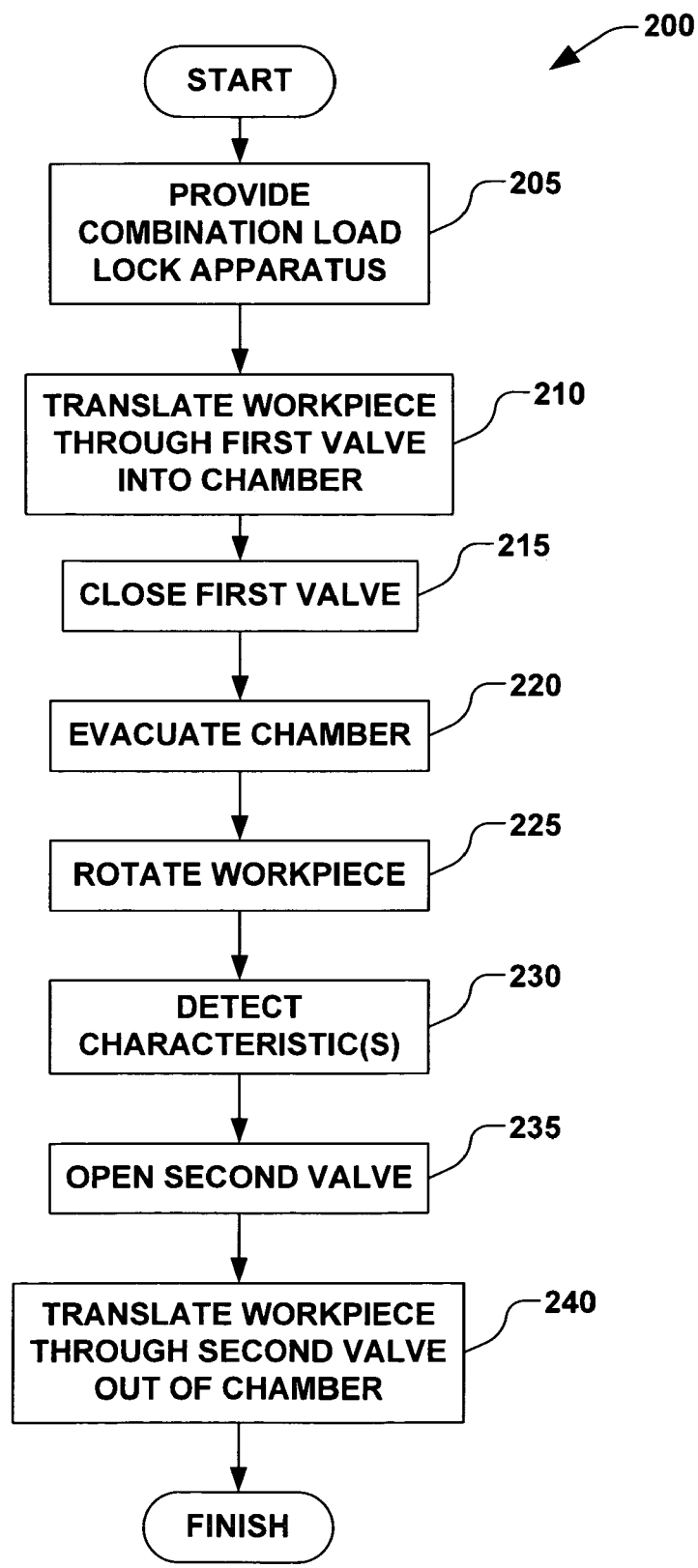
FIG. 4 is a block diagram of an exemplary method for handling and characterizing a workpiece according to another exemplary aspect of the invention.

In accordance with still another aspect of the present invention, a method 200 for handing a workpiece is provided in FIG. 4. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 5A:
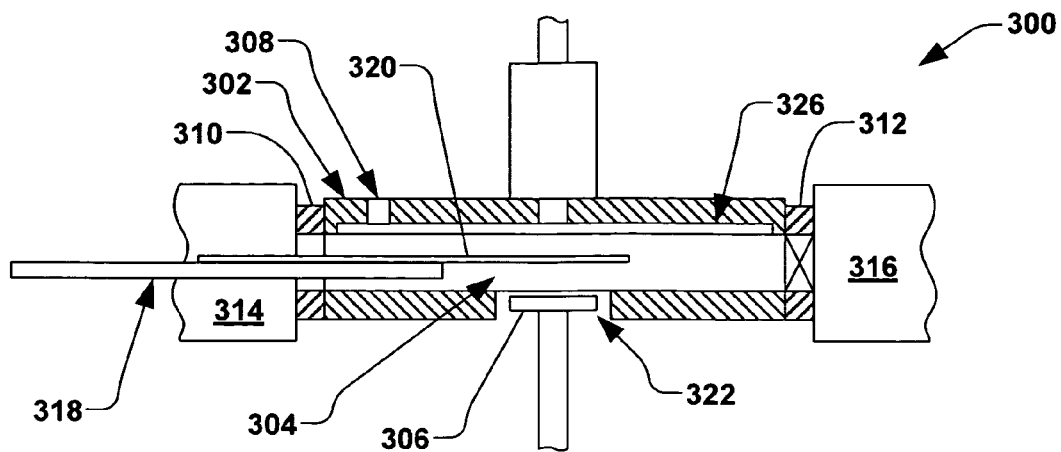
FIGS. 5A-5E illustrate cross-sectional views of a combination load lock apparatus at various stages during workpiece handling according to another aspect of the invention.

As illustrated in FIG. 4, the method 200 begins with providing a combination load lock apparatus in act 205. For example, FIG. 5A illustrates an exemplary combination load lock apparatus 300 being provided in act 205. The combination load lock apparatus 300, for example, comprises a chamber 302 having an interior portion 304, a support member 306 positioned within the interior portion, a detection apparatus 308 associated with the interior portion, a first valve 310, and a second valve 312. The first valve 310, for example, is in selective fluid communication with a first volume 314 (e.g., atmosphere) and the interior portion 304 of the chamber, while the second valve 312 is in selective fluid communication with a second volume 316 (e.g., a process chamber) and the interior portion of the chamber.

Figure 5B:
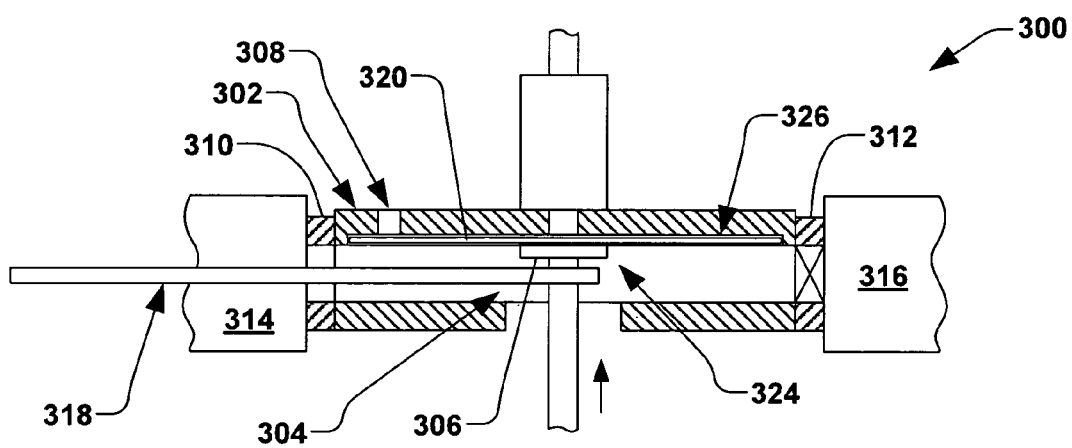

In act 210 of FIG. 4, a workpiece is generally translated through the first valve from the first volume into the interior portion of the chamber when the first valve is in an open position and the second valve is in a closed position, wherein the workpiece is generally placed onto the support member within the chamber. As illustrated in FIG. 5A, the first valve 310 is opened and a first transfer arm 318 (e.g., a robotic arm or holder) having a workpiece 320 disposed thereon is generally translated from the first volume 314 through the first valve and into the interior portion 304 of the chamber 302. The support member 306, for example, is in a lowered position 322 when the workpiece 320 is translated into the chamber 302. As illustrated in FIG. 5B, the support member 306, for example, is raised from the lowered position 322 of FIG. 5A to a raised position 324 within the interior region 304 of the chamber 302, therein generally lifting the workpiece 320 from the first transfer arm 318, wherein the first transfer arm may be retracted from the chamber. In accordance with one example, the support member 306 further translates the workpiece 320 into a recess 326 defined in the interior region 304 of the chamber 302 in act 210 of FIG. 4.

Figure 5C:
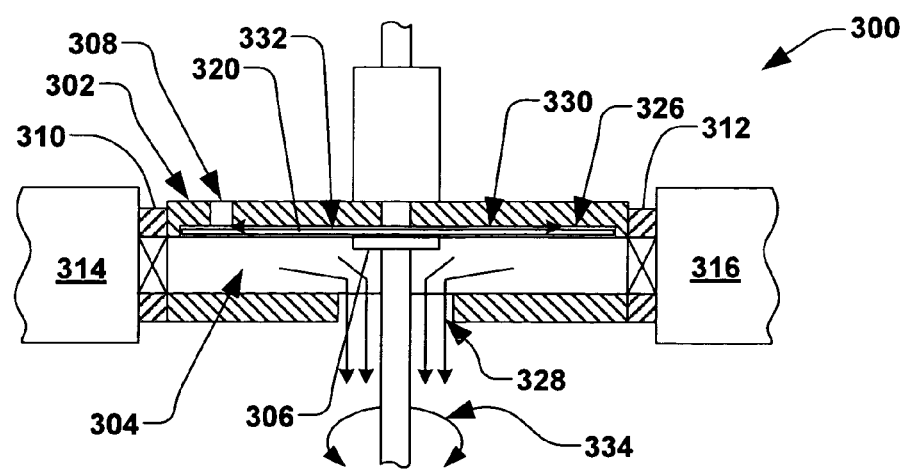

In act 215 of FIG. 4, the first valve is generally closed, and in act 220, the interior portion of the chamber is generally evacuated. As illustrated in FIG. 5C, the interior region 304 of the chamber 302 is generally evacuated through a pump port 328 associated with the chamber. As illustrated, the workpiece 320 is positioned within the recess 326, thus generally permitting a laminar flow 330 (indicated by arrows) along a surface 332 of the workpiece during the evacuation, thus generally limiting contamination to the surface from contaminants (not shown) residing within the interior region 304 of the chamber 302.

In act 225 of FIG. 4, the support member is rotated about the first axis, wherein the workpiece is consequently rotated within the chamber. During the rotation of the workpiece in act 225, one or more characteristics of the workpiece are detected in act 230, such as a detection of a bar code or other indicia or characteristic of the workpiece (e.g., a notch in the workpiece). For example, FIG. 5C illustrates the workpiece 320 being rotated (indicated by arrow 334), wherein the detection apparatus 308 generally detects a notch or other indicia (not shown) associated with the workpiece during the rotation thereof. The workpiece 320 may then be rotated in a predetermined manner based on the detection of the notch or other indicia, wherein, for example, the notch is generally aligned with respect to the chamber 302 or other component(s). Such an alignment of the notch within the combination load lock apparatus 300 eliminates a workpiece handling step that is conventionally performed once the workpiece is removed from a conventional load lock chamber, and such an elimination of a handling step advantageously increases workpiece throughput. For example, by allowing for the parallel operation of notch alignment during load lock pump down, the present invention advantageously decreases time spent between workpiece processing operations.

Figure 5D:
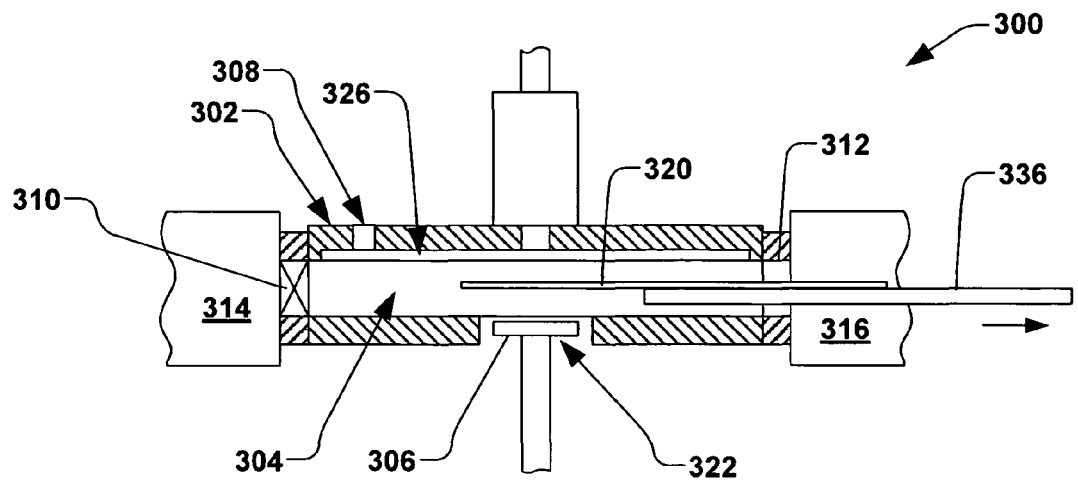

In act 235 of FIG. 4, the second valve is opened, and the workpiece is subsequently translated from the chamber through the second valve and into the second volume in act 240. The support member 306 of FIG. 5C, for example, is lowered from the raised position 324 to the lowered position 322 of FIG. 5D, wherein the workpiece 320 is lowered onto a second transfer arm 336 that generally extends through the second valve 312 from the second volume 316. The second transfer arm 336 and workpiece 320 are then translated through the second valve 312 and into the second volume 316.

Figure 5E:
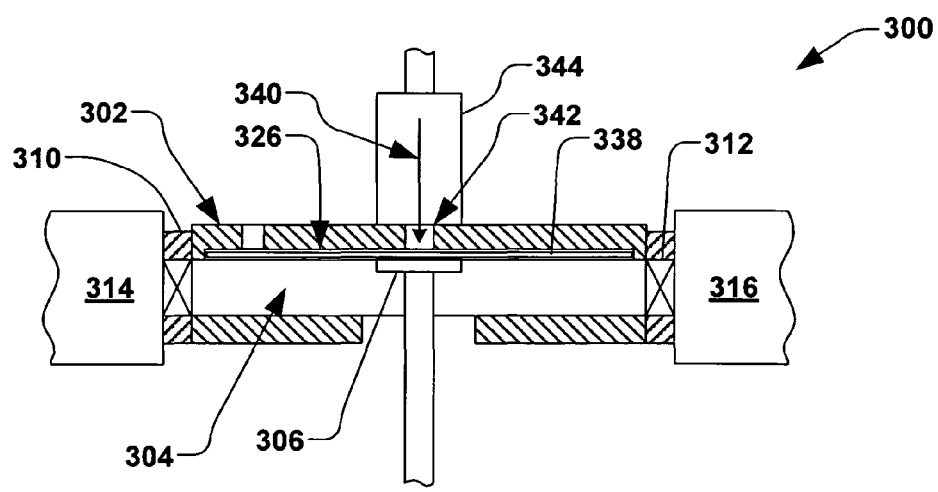

In accordance with one example, a second workpiece 338 is transferred from the second volume 316 and onto the support member 306 within the chamber 302, and the second workpiece is again raised into the recess 326, as illustrated in FIG. 5E. While the second workpiece 338 is positioned within the recess 326 a pressurized gas (e.g., an inert gas or atmospheric gases indicated by arrow 340) may be introduced into the chamber 302 via a vent port 342, wherein the pressurized gas is further filtered via a high efficiency filter 344 prior to entering the interior portion 304 of the chamber 302. Again, since the second workpiece 338 is generally positioned within the recess 326, substantially laminar flow is believed to occur, thus mitigating potential contamination seen in conventional load lock chambers, wherein turbulent flow is typically experienced by workpieces.

Accordingly, the present invention provides an efficient combination load lock chamber, wherein productivity and efficiency is advantageously increased over the prior art by combining alignment and/or other workpiece detection processes with pump-down operations performed by the load lock chamber. It should be noted that although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A combination load lock apparatus, comprising:
    a load lock chamber having a top wall and a bottom wall generally fixed with respect to one another, wherein an interior portion of the load lock chamber is defined between the top wall and the bottom wall, wherein the top wall of the load lock chamber comprises a generally planar first surface and a recess extending upwardly from the generally planar first surface, and wherein a central region of the load lock chamber is generally defined between the bottom wall and the generally planar first surface of the top wall;
    two or more valves operably coupled to the load lock chamber, wherein the two or more valves are operable to selectively permit a fluid communication between two or more respective volumes and the interior portion of the load lock chamber;
    a support member disposed within the interior portion of the load lock chamber, wherein the support member is operable to support a workpiece;
    a translation apparatus operably coupled to the support member, wherein the translation apparatus is operable to rotate the support member about a first axis and to linearly translate the support member along the first axis between the central region of the load lock chamber and the recess; and
    a detection apparatus operably coupled to at least the top wall of the load lock chamber, wherein the detection apparatus is operable to detect one or more characteristics of the workpiece when the workpiece is positioned within the recess.

2. The combination load lock apparatus of claim 1, wherein the support member comprises an electrostatic chuck.

3. The combination load lock apparatus of claim 1, wherein the workpiece comprises an indicia associated therewith, and wherein the detection apparatus comprises a sensor operable to detect the indicia.

4. The combination load lock apparatus of claim 3, wherein the indicia comprises a bar code disposed on a backside of the workpiece, and wherein the sensor comprises a barcode scanner.

5. The combination load lock apparatus of claim 3, wherein the indicia comprises a notch defined in the workpiece, and wherein the detection apparatus comprises a sensor operable to detect the notch.

6. The combination load lock apparatus of claim 5, wherein the sensor comprises a camera operable to visually detect the notch in the workpiece.

7. The combination load lock apparatus of claim 5, wherein the sensor device comprises a proximity sensor.

8. The combination load lock chamber of claim 1, wherein the detection apparatus is further operably coupled to the bottom wall of the load lock chamber.

9. The combination load lock apparatus of claim 1, wherein the detection apparatus is operable to detect the one or more characteristics of the workpiece during the rotation of the workpiece about the first axis via the translation apparatus.

10. The combination load lock apparatus of claim 1, wherein the two or more valves comprise two or more gate valves associated with the two or more respective volumes, wherein the two or more gate valves are operable to selectively isolate an environment of each of the respective two or more volumes from interior portion of the load lock chamber.

11. The combination load lock apparatus of claim 1, further comprising a pump port and a vent port associated with the load lock chamber, wherein the pump port is in fluid communication with a vacuum environment and the interior portion of the load lock chamber, wherein the pump port is operable to selectively expose the interior portion of the load lock chamber to the vacuum environment, and wherein the vent port is in fluid communication with a pressurized environment and the interior portion of the load lock chamber, wherein the vent port is operable to selectively expose the interior portion of the load lock chamber to the pressurized environment.

12. The combination load lock apparatus of claim 11, wherein the pump port is associated with a bottom portion of the load lock chamber.

13. The combination load lock apparatus of claim 11, further comprising a filter in fluid communication with the vent port, wherein the filter is operable to substantially filter particles associated with the pressurized environment.

14. The combination load lock apparatus of claim 1, further comprising a temperature control apparatus associated with the load lock chamber, wherein the temperature control apparatus is operable to provide one or more of a heating and cooling of the workpiece within the load lock chamber.

15. The combination load lock apparatus of claim 1, wherein a shape of the recess generally conforms to a shape of the workpiece when viewed from the bottom wall toward the top wall of the load lock chamber.

16. The combination load lock apparatus of claim 15, wherein the recess is generally circular in shape having diameter slightly larger than a diameter of the workpiece.

17. A combination load lock apparatus, comprising:
a load lock chamber having a generally fixed top wall and a generally fixed bottom wall, wherein an interior portion of the load lock chamber is defined between the top wall and the bottom wall, wherein the top wall of the load lock chamber comprises a generally planar first surface and a recess extending upwardly from the generally planar first surface, and wherein a central region of the load lock chamber is generally defined between the bottom wall and the generally planar first surface of the top wall;
two or more valves operably coupled to the load lock chamber, wherein the two or more valves are operable to selectively permit a fluid communication between two or more respective volumes and the interior portion of the load lock chamber;
a support member disposed within the interior portion of the load lock chamber, wherein the support member is operable to support a workpiece;
a translation apparatus operably coupled to the support member, wherein the translation apparatus is operable to rotate the support member about a first axis and to linearly translate the support member along the first axis, wherein the translation apparatus is configured to translate the workpiece between the central region of the load lock chamber and the recess; and
a detection apparatus operably coupled to the top wall of the load lock chamber or the top wall and bottom wall of the load lock chamber, wherein the detection apparatus is operable to detect one or more characteristics of the workpiece when the workpiece is positioned within the recess.

18. The combination load lock apparatus of claim 17, further comprising:
a pump port associated with the bottom wall of the load lock chamber, wherein the pump port is in selective fluid communication with the interior portion of the load lock chamber and a vacuum environment;
a vent port associated with the recess, wherein the vent port in selective fluid communication with the interior portion of the load lock chamber and a pressurized environment;
a controller configured to control a position of the workpiece via the translation apparatus, and wherein the controller is further configured to control an actuation of the pump port and vent port in order to provide a flow of a gas from the vent port to the pump port when the workpiece is positioned within the recess.

19. The combination load lock apparatus of claim 18, further comprising a temperature control apparatus configured to heat and/or cool the gas from the pressurized environment.

* * * * *

UNITED STATES PATENT AND TRADEMARK OFFICE
CERTIFICATE OF CORRECTION

PATENT NO. : 7,828,504 B2 Page 1 of 1
APPLICATION NO. : 11/432923
DATED : November 9, 2010
INVENTOR(S) : Michel Pharand et al.

It is certified that error appears in the above-identified patent and that said Letters Patent is hereby corrected as shown below:

Title Page, Item (73) Assignee: please replace "Axcellis Technologies, Inc." with --Axcelis Technologies, Inc.--

Signed and Sealed this

Twenty-first Day of December, 2010

David J. Kappos
*Director of the United States Patent and Trademark Office*